(12) United States Patent
Shirouzu et al.

(10) Patent No.: US 8,563,993 B2
(45) Date of Patent: Oct. 22, 2013

(54) DISPLAY DEVICE AND FABRICATION METHOD FOR DISPLAY DEVICE

(75) Inventors: Hiroshi Shirouzu, Shiga (JP); Kenichi Tajika, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/472,991

(22) Filed: May 16, 2012

(65) Prior Publication Data

US 2012/0326176 A1 Dec. 27, 2012

Related U.S. Application Data

(63) Continuation of application No. PCT/JP2011/003653, filed on Jun. 27, 2011.

(51) Int. Cl.
| | |
|---|---|
| *G02F 1/1343* | (2006.01) |
| *G02F 1/1333* | (2006.01) |
| *G02F 1/13* | (2006.01) |
| *H01L 29/04* | (2006.01) |
| *H01L 29/10* | (2006.01) |
| *H01L 21/00* | (2006.01) |
| *H01L 29/20* | (2006.01) |
| *H01L 29/12* | (2006.01) |
| *H01L 29/786* | (2006.01) |
| *H01L 29/26* | (2006.01) |

(52) U.S. Cl.
USPC ............ 257/88; 257/59; 257/71; 257/79; 257/E21.521; 257/E33.062; 438/4; 438/34; 349/38; 349/39; 349/54; 349/55; 349/192

(58) Field of Classification Search
USPC .......... 257/59, 71, 79, 88, E21.521, E33.062; 438/4, 22, 30, 34; 349/38, 39, 54, 55, 349/192
See application file for complete search history.

(56) References Cited

U.S. PATENT DOCUMENTS 4,728,175 A * 3/1988 Baron .......................... 349/38
5,042,916 A 8/1991 Ukai et al.
(Continued)

FOREIGN PATENT DOCUMENTS

| JP | 3-194516 | 8/1991 |
|---|---|---|
| JP | 4-347821 | 12/1992 |
| JP | 9-090408 | 4/1997 |

(Continued)

OTHER PUBLICATIONS

U.S. Appl. No. 13/473,054 to Hiroshi Shirouzu et al., filed May 16, 2012.

*Primary Examiner* — Fernando L Toledo
*Assistant Examiner* — Aaron Gray
(74) *Attorney, Agent, or Firm* — Greenblum & Bernstein, P.L.C.

(57) ABSTRACT

A capacitor unit in a display device includes: a capacitor element having a first capacitor electrode connected to a power line and provided in a GM electrode layer and a second capacitor electrode connected to a line and provided in an SD electrode layer; a backup capacitor element having a first backup capacitor electrode provided in the GM electrode layer and a second backup capacitor electrode connected to the power line and provided in the SD electrode layer; a disconnect-able portion at which a connection between the second capacitor electrode and the line can be disconnected; and a connectable portion at which the first backup capacitor electrode and the line can be connected, and the disconnect-able portion and the connectable portion are arranged at a position in which the disconnect-able portion and the connectable portion overlap in a stacking direction.

10 Claims, 16 Drawing Sheets

(56) References Cited

U.S. PATENT DOCUMENTS

| | | | |
|---|---|---|---|
| 5,337,173 A | 8/1994 | Atsumi et al. | |
| 6,753,935 B2 * | 6/2004 | Wu | 349/54 |
| 2005/0259190 A1 * | 11/2005 | Wang et al. | 349/38 |
| 2008/0309841 A1 * | 12/2008 | Yagi et al. | 349/54 |
| 2011/0141376 A1 * | 6/2011 | Tsubata | 348/731 |
| 2012/0056538 A1 * | 3/2012 | Shirouzu et al. | 315/51 |

FOREIGN PATENT DOCUMENTS

| | | | |
|---|---|---|---|
| JP | 2001-125137 A | | 5/2001 |
| JP | 2003-15549 A | | 1/2003 |
| JP | 2003015549 A | * | 1/2003 |

* cited by examiner

Unrepaired
Ca & Cb connected, Cp not connected

SD (upper) electrode layer 112
GM (lower) electrode layer 111

DISPLAY DEVICE AND FABRICATION METHOD FOR DISPLAY DEVICE

CROSS REFERENCE TO RELATED APPLICATION

This is a continuation application of PCT Patent Application No. PCT/JP2011/003653 filed on Jun. 27, 2011, designating the United States of America. The entire disclosures of the above-identified application, including the specification, drawings and claims are incorporated herein by reference in their entirety.

BACKGROUND OF THE INVENTION (1) Field of the Invention

The present invention relates to display devices and fabrication methods for the display devices, and particularly to a display device having a repairable pixel structure and a fabrication method for the display device.

(2) Description of the Related Art

Organic EL displays using organic electro-luminescence elements (hereafter referred to as organic EL elements) have been known as image display devices using current-driven light-emitting elements. Since the organic EL displays have advantages such as good viewing angle characteristics and small power consumption, the organic EL displays have been attracting attention as a candidate for a next-generation flat panel display (FPD).

Usually, the organic EL elements composing the pixels are arranged in a matrix. For example, in an active-matrix organic EL display, thin film transistors (TFT) are provided at crosspoints of scanning lines and data lines, and capacitor units (capacitors) and gates of drive transistors are connected to the TFTs. The TFTs are turned on through selected scanning lines, and data signals from the data lines are inputted to the drive transistors and the capacitor units. With the drive transistors and the capacitor units, the timing of light-emission from the organic EL elements is controlled. With the configuration of the pixel drive circuit, in the active-matrix organic EL display, the organic EL elements can keep emitting light until next scanning (selection). Accordingly, the luminance of the display does not decrease even if the duty cycle increases. However, as typically shown in the active-matrix organic EL display, as the configuration of the drive circuit for light-emitting pixels becomes more complex, and as the number of the light-emitting pixels increases, the number of electric malfunction such as short-circuit or opening of the circuit elements and lines increases in the fabrication process that requires microfabrication.

In particular, in the organic EL panel, the area for the capacitor elements included in the pixel drive circuit is relatively large. As a result, the capacitor elements are susceptible to the influence of particles and others between electrodes, causing an increased pixel malfunction rate due to malfunction such as short-circuit.

The short-circuit in the capacitor element can be repaired by disconnecting the capacitor unit from other normal part by laser irradiation and current supply. A pixel circuit provided with a backup capacitor element has been developed in order to prevent a change in the pixel characteristics due to reduced capacitance by separating the malfunctioning capacitor unit has been developed.

FIG. 12 is a circuit diagram illustrating a part of the screen of the liquid crystal display device disclosed in the patent literature 1. FIG. 12 illustrates a circuit configuration of the display unit in which pixels are arranged in a matrix. The display unit includes a scanning line 501 and a capacitor line 502 which are arranged for each row of the pixels, and a signal line 503 provided for each column of pixels. Each pixel includes a pixel TFT 504, capacitor elements 505a and 505b which are connected in parallel (505a and 505b have an approximately the same capacitance value), a pixel electrode 520, a common electrode 506, and a liquid crystal element 507, and a capacitor element 508 for repair is provided together with the capacitor elements 505a and 505b. The capacitor element 508 is arranged to have a capacitance value approximately same as the capacitor element 505a (or 505b), and is usually separated from the pixel electrode 520.

In the configuration described above, for example, as the pixel at the center of FIG. 12, the capacitor element 505b is short-circuited due to the dust during the fabrication process. Without any adjustment, the pixel electrode 520 is directly connected to the capacitor line 502. Consequently, voltage is not applied to the liquid crystal element 507, causing pixel defect. Thus, the disconnect-able portion 510 is disconnected by laser irradiation, and laser contact is performed on the connectable portion 511. At the connectable portion 511, two types of lines are overlapped opposite to each other via the interlayer insulating film, and the two types of lines are connected by the laser irradiation on the overlapping part. With this, even when the capacitor element 505b is short-circuited, it is possible to disconnect the capacitor element 505b, and to connect the capacitor element 508 for repair.

With the configurations of the disconnect-able portion 510 and the connectable portion 511 and the laser irradiation on them, it is possible to repair the pixel to a normal state even if part of the capacitor element in the pixel circuit is short-circuited, without reducing the capacitance held by the repaired pixel.

SUMMARY OF THE INVENTION

However, in the repairable display device disclosed in Patent Literature 1: Japanese Unexamined Patent Application Publication No. 2003-15549, it is necessary to provide a capacitor element for repair in the pixel circuit, and to secure space for separately providing a connectable portion for connecting the capacitor element and a disconnect-able portion for disconnecting the capacitor element malfunctioning due to short-circuit. More specifically, it is necessary to independently secure a region for irradiating laser for connection and a region for irradiating laser for disconnection so as to prevent the circuit elements and lines nearby from damaged by laser irradiation. For this reason, it is difficult to reduce area for the pixel circuit for increasing definition in the display unit.

In addition, two different repair processes, namely, disconnecting the conducting portions and connecting insulated portions, there is a problem of fabrication processes.

The present invention has been conceived in view of the problems, and it is an object of the present invention to provide a display device that can suppress the reduction in capacitance even when the capacitor element is repaired, and capable of reducing area with simplified repair process and a fabrication method for the display device.

In order to solve the problems above, the display device according to the present invention is a display device including a two-dimensional array of a plurality of display pixels each having a display element layer and a drive circuit layer stacked, the drive circuit layer being for driving the display element layer, wherein the drive circuit layer includes a parallel-plate capacitor unit having a first electrode layer, a second electrode layer, and an insulating layer, the first electrode layer and the second electrode layer being arranged opposite to each other in a stacking direction, and the insulating layer being provided between the first electrode layer and the second electrode layer, the parallel-plate capacitor unit includes: a capacitor element having a first capacitor electrode and a second capacitor electrode, the first capacitor electrode being electrically connected to a first line and provided in the first electrode layer, the second capacitor electrode being electrically connected to a second line and provided in the second electrode layer opposite to the first capacitor electrode in the stacking direction; a backup capacitor element having a first backup capacitor electrode provided in the first electrode layer and a second backup capacitor electrode electrically connected to the first line and provided in the second electrode layer opposite to the first backup capacitor electrode in the stacking direction; a disconnect-able portion at which an electric connection between the second capacitor electrode and the second line can be disconnected; and a connectable portion at which the first backup capacitor electrode and the second line can be electrically connected, and the disconnect-able portion and the connectable portion are arranged at a position in which the disconnect-able portion and the connectable portion overlap in the stacking direction.

According to the display device and the fabrication method for the display device according to the present invention, it is possible to disconnect the malfunctioning capacitor element from the pixel circuit and connect the backup capacitor element to the pixel circuit at the same time by irradiating with laser the connecting part of the capacitor unit with the malfunction. More specifically, one laser process allows disconnection of the malfunctioning capacitor element and connection of the backup capacitor element, and reduces the area for the process and the number of processes. Therefore, it is possible to simplify the fabrication process and reduces the area for the process while securing the hold capacitance.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings.

DESCRIPTION OF THE PREFERRED EMBODIMENT

Figure 1:
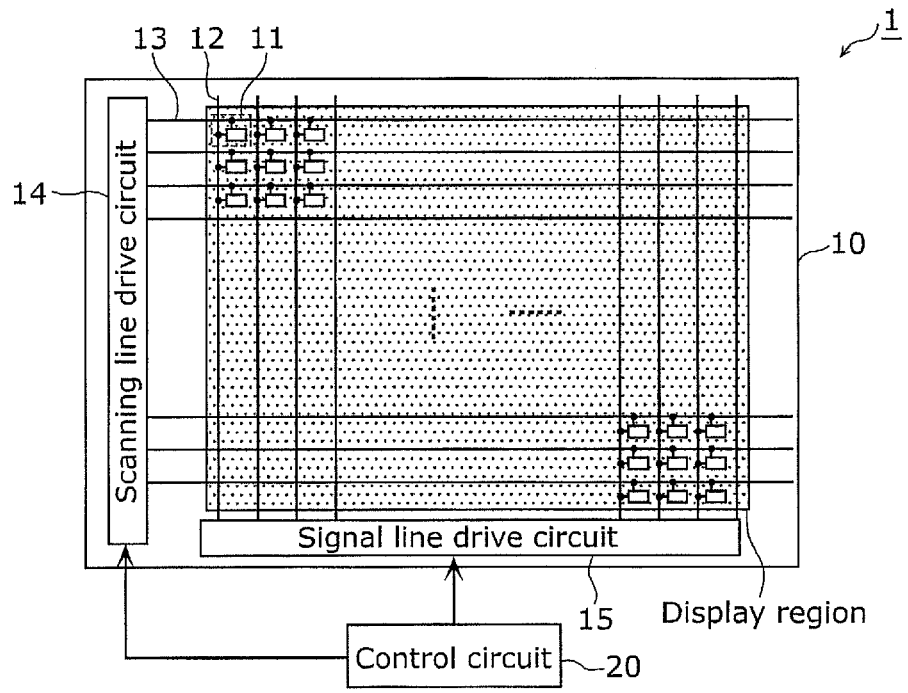
FIG. 1 is a block diagram illustrating the configuration of the display device according to the embodiment of the present invention.

A display device according to an aspect of the present invention is a display device including a two-dimensional array of a plurality of display pixels each having a display element layer and a drive circuit layer stacked, the drive circuit layer being for driving the display element layer, wherein the drive circuit layer includes a parallel-plate capacitor unit having a first electrode layer, a second electrode layer, and an insulating layer, the first electrode layer and the second electrode layer being arranged opposite to each other in a stacking direction, and the insulating layer being provided between the first electrode layer and the second electrode layer, the parallel-plate capacitor unit includes: a capacitor element having a first capacitor electrode and a second capacitor electrode, the first capacitor electrode being electrically connected to a first line and provided in the first electrode layer, the second capacitor electrode being electrically connected to a second line and provided in the second electrode layer opposite to the first capacitor electrode in the stacking direction; a backup capacitor element having a first backup capacitor electrode provided in the first electrode layer and a second backup capacitor electrode electrically connected to the first line and provided in the second electrode layer opposite to the first backup capacitor electrode in the stacking direction; a disconnect-able portion at which an electric connection between the second capacitor electrode and the second line can be disconnected; and a connectable portion at which the first backup capacitor electrode and the second line can be electrically connected, and the disconnect-able portion and the connectable portion are arranged at a position in which the disconnect-able portion and the connectable portion overlap in the stacking direction.

When the malfunction is found in the capacitor element and the capacitor unit is repaired by changing the electric connection from the capacitor element to the backup capacitor element, the disconnect-able portion and the connectable portion are provided at a position overlapping with each other in the stacking direction according to the present invention, thereby allowing disconnection of the capacitor element and connection of the backup capacitor element with one process. With this, it is possible to suppress the area of the region to be processed to the minimum, and the number of repair processes is reduced. Therefore, it is possible to simplify the fabrication process and reduce the area while maintaining the hold capacitance.

In addition, in the display device according to an aspect of the present invention, it is preferable that the disconnect-able portion is provided on a line connecting the second capacitor electrode and the second line, and has a shape that allows fusion-cutting of the connection between the second capacitor electrode and the second line by laser irradiation, and the connectable portion includes a line for connection extended from the first backup capacitor electrode to a position overlapping with the disconnect-able portion, and has a shape that allows welding, by laser irradiation, of the line for connection and the second line disconnected from the second capacitor electrode.

With this, for the disconnect-able portion and the connectable portion, it is possible to disconnect the disconnect-able portion and to connect the connectable portion with one laser irradiation. In addition, the line for connection extended from the first backup capacitor electrode and the second line connecting the capacitor electrodes are irradiated with laser, and thus highly accurate repair process can be achieved without damaging the backup capacitor electrode and the capacitor electrode due to laser irradiation.

In addition, in the display device according to an aspect of the present invention, it is preferable that the line for connection has an end surface in parallel with the stacking direction above the disconnect-able portion.

With this, when the end portion of the line for connection melts by laser irradiation, the area at an end surface of the line for connection which serves as a welding portion with the second line is secured. Thus, it is possible to securely weld the first backup capacitor electrode and the second line via the line for connection.

In addition, in the display device according to an aspect of the present invention, the parallel-plate capacitor unit may include two of the capacitor elements and one of the backup capacitor element.

With this, compared to a capacitor unit having one capacitor element and one backup capacitor element, it is possible to reduce the capacitance of the backup capacitor element to half. Thus, it is possible to reduce the area of the backup capacitor element to approximately half, contributing to the reduction in the area.

In addition, in the display device according to an aspect of the present invention, the second backup capacitor electrode may be electrically connected to the first line via a contact hole provided in the insulating layer.

With this, the backup capacitor element is connected to the circuits and lines nearby with the electrode layer reversed from the capacitor element. Thus, it is possible to simplify the line layout for connecting the capacitor element and the backup capacitor element to the line having reversed electrode layers, for example.

In addition, in the display device according to an aspect of the present invention, the capacitor element may be a holding capacitor element which holds, as a hold voltage, a voltage according to a signal voltage applied to each of the display pixels, the drive circuit layer may include a drive transistor having a gate electrode connected to one of the terminals of the capacitor element, and converts the hold voltage to a signal current which is a current between a source electrode and a drain electrode through an application of the hold voltage to the gate electrode, and the display element layer may include a light-emitting element which emits light when the signal current flows.

With this, the present invention is applicable to an active-matrix display device in which timing for applying signal voltage and timing for light emission can be controlled independently.

In addition, in the display device according to an aspect of the present invention, it is preferable that one of the first electrode layer and the second electrode layer is provided in one of a source-drain electrode layer and a gate electrode layer of the drive transistor, and the other of the first electrode layer and the second electrode layer is provided in the other of the source-drain electrode layer and the gate electrode layer of the drive transistor.

With this, upon configuring the parallel-plate capacitor unit included in the display device according to the present invention, it is not necessary to stack an electrode layer separately, and the source-drain electrode layer and the gate electrode layer used for drive transistor which is the existing component are used, thereby reducing the area of the pixel circuit and simplifying the fabrication process.

Furthermore, the present invention can not only be implemented as the display device having the characteristic units, but also as a fabrication method for the display device having characteristic components included in the display device as steps.

The following shall describe the embodiments according to the present invention with reference to the drawings. Note that in the following embodiments and drawings, the same reference numerals are assigned to the same components. The following shall describe a display device including a top-emission organic EL element having an anode on the lower surface and a cathode on the upper surface as an example. However, it is not limited to this example.

(Embodiment 1)

The display device according to the embodiment 1 includes a two-dimensional array of a plurality of display pixels each having a display element layer and a drive circuit layer stacked, the drive circuit layer being for driving the display element layer. The drive circuit layer includes a parallel-plate capacitor unit having a first electrode layer, a second electrode layer, and an insulating layer, the first electrode layer and the second electrode layer being arranged opposite to each other in a stacking direction, and the insulating layer being provided between the first electrode layer and the second electrode layer. The parallel-plate capacitor unit includes: a capacitor element having a first capacitor electrode and a second capacitor electrode, the first capacitor electrode being electrically connected to a first line and provided in the first electrode layer, the second capacitor electrode being electrically connected to a second line and provided in the second electrode layer opposite to the first capacitor electrode in the stacking direction; a backup capacitor element having a first backup capacitor electrode provided in the first electrode layer and a second backup capacitor electrode electrically connected to the first line and provided in the second electrode layer opposite to the first backup capacitor electrode in the stacking direction; a disconnect-able portion at which an electric connection between the second capacitor electrode and the second line can be disconnected; and a connectable portion at which the first backup capacitor electrode and the second line can be electrically connected. The disconnect-able portion and the connectable portion are arranged at a position in which the disconnect-able portion and the connectable portion overlap in the stacking direction. With this, it is possible to disconnect the capacitor element and connect the backup capacitor element at the same time by laser irradiation, suppressing the area for repair processing region to the minimum.

The following shall describe the embodiment 1 according to the present invention with reference to the drawings.

FIG. 1 is a block diagram illustrating the configuration of the display device according to the embodiment of the present invention. The display device 1 in FIG. 1 includes a display panel 10 and a control circuit 20. The display panel 10 includes multiple light-emitting pixels 11, signal lines 12 each provided for a corresponding column of the light-emitting pixels, scanning lines 13 each provided for a corresponding row of light-emitting pixels, a scanning line drive circuit 14, and a signal line drive circuit 15.

The light-emitting pixels 11 are display pixels arranged in a matrix on the display panel 10.

The scanning line drive circuit 14 drives the circuit elements included in the light-emitting pixels by outputting scanning signals to each of the scanning lines 13.

The signal line drive circuit 15 achieves light-emission from the light-emitting pixels according to a luminance signal by outputting a signal voltage and a reference voltage to the signal lines 12.

The control circuit 20 controls the timing for outputting the scanning signal output from the scanning line drive circuit 14. The control circuit 20 also controls the timing for outputting the signal voltage output from the signal line drive circuit 15.

Figure 2:
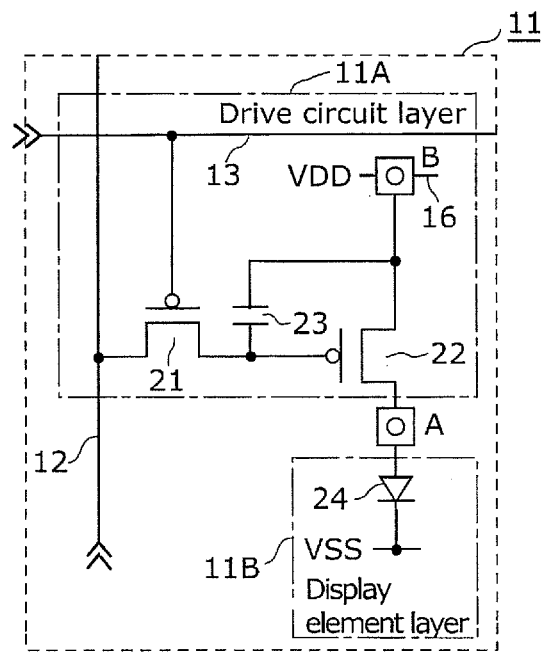
FIG. 2 is an example of a main circuit configuration of the light-emitting pixel according to the embodiment of the present invention.

FIG. 2 is an example of the main circuit configuration diagram of the light-emitting pixel according to the embodiment 1 of the present invention. The light-emitting pixel 11 in FIG. 2 includes a drive circuit layer 11A and the display element layer 11B. The drive circuit layer 11A includes, for example, a switching transistor 21, a drive transistor 22, and a capacitor unit 23. The source electrode of the switching transistor 21 is connected to the signal line 12, the gate electrode of the switching transistor 21 is connected to the scanning line 13, and the drain electrode of the switching transistor 21 is connected to the capacitor unit 23 and the gate electrode of the drive transistor 22. The source electrode of the drive transistor 22 is connected to the power line 16 via the connecting point B, and the drain electrode of the drive transistor 22 is connected to the anode of the organic EL element 24 via the connecting point A. The connecting points A and B are contact holes provided in the interlayer insulating film for electrically connecting different electrode layers, for example.

In this configuration, if the scanning signal is input to the scanning lines 13, and the switching transistor 21 is turned on, the signal voltage supplied via the signal line 12 is written on the capacitor unit 23. The hold voltage written on the capacitor unit 23 is held for one frame period, and conductance of the drive transistor 22 changes in an analog manner, and a driving current corresponding to the tone of emitted light is supplied to the anode of the organic EL element 24. The driving current supplied to the anode of the organic EL element 24 flows to the cathode of the organic EL element 24. With this, the organic EL element 24 in the display element layer 11B emits light, and an image is displayed.

Note that, the drive circuit layer 11A is not limited to the circuit configuration described above. More specifically, although the switching transistor 21, the drive transistor 22, and the capacitor unit 23 are necessary elements composing the circuit for causing the driving current to flow according to the voltage value of the signal voltage to the display element layer 11B, the configuration is not limited to the configuration described above. A case in which another circuit configuration element is added to the circuit configuration elements described above is also included in the drive circuit layer 11A according to the present invention.

The drive circuit layer 11A and the display element layer 11B are stacked above a glass substrate, for example, and multiple display pixels are arranged two-dimensionally. When the display device 1 is a top-emission structure, that is, when voltage is applied to the display element layer 11B, the organic EL element 24 emits light, and the light travels to above through a transparent cathode and a sealing film. In addition, among the downward light emitted from the organic EL element 24, the light is reflected on the anode, and travels to above through the transparent cathode and the sealing film.

Next, the structure and function of the capacitor unit 23 which is the main component of the present invention shall be described.

The capacitor unit 23 is a parallel plate capacitor unit including a first electrode layer and a second electrode layer which are arranged opposite to each other in the stacking direction, and an insulating layer between the first electrode layer and the second electrode layer.

Figure 3A:
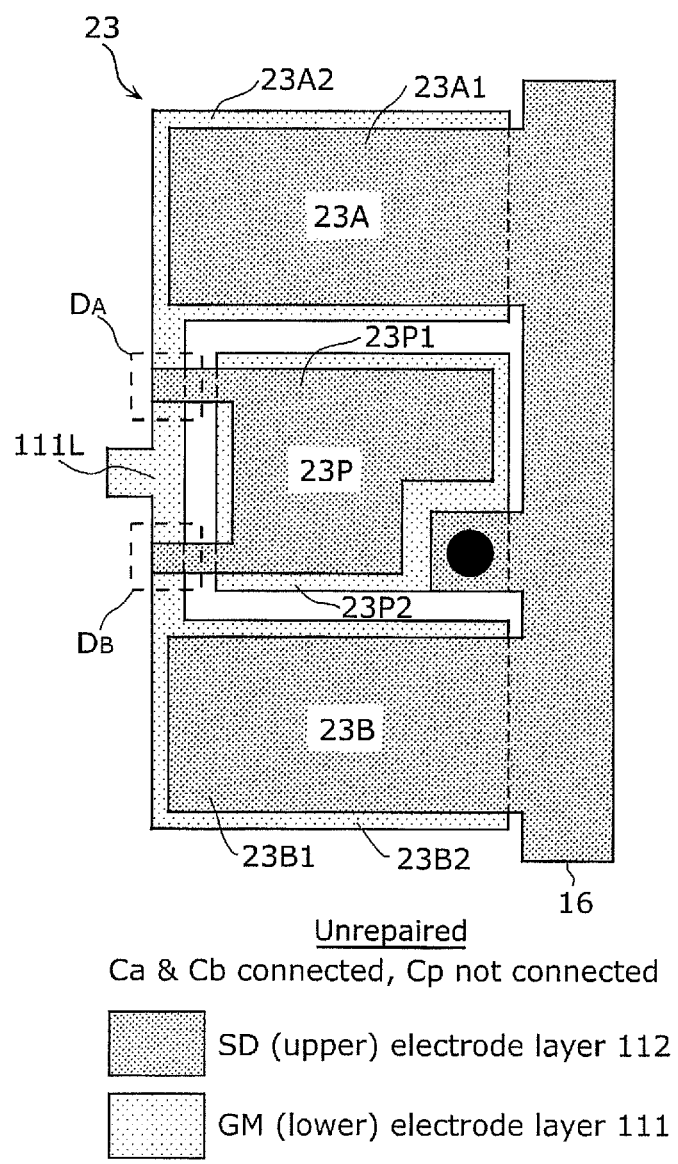
FIG. 3A is a top perspective view illustrating the electrode configuration of the capacitor element included in the light-emitting pixel according to the embodiment 1, which does not require repair.

FIG. 3A is an upper perspective view illustrating the electrode configuration of the capacitor unit included in the light-emitting pixel according to the embodiment 1, which does not require repair. FIG. 3A illustrates an example of the configuration of the capacitor unit 23 provided for each light-emitting pixel 11. The capacitor unit 23 includes capacitor elements 23A and 23B, and a backup capacitor element 23P. More specifically, the capacitor unit 23 includes two capacitor elements and one backup capacitor element. With this configuration, compared to a case in which the capacitor unit is configured with one capacitor element and one backup capacitor element, it is possible to reduce the capacitance of the backup capacitor element to half. Thus, it is possible to reduce the area of the backup capacitor element to approximately half, contributing to the reduction in the area.

The capacitor element 23A included in the capacitor unit 23 is composed of a first capacitor electrode 23A1 provided in an SD electrode layer 112 which is the first electrode layer, and a second capacitor electrode 23A2 provided in a GM electrode layer 111 which is the second electrode layer. The first capacitor electrode 23A1 and the second capacitor electrode 23A2 are opposite to each other in the stacking direction. In addition, the capacitor element 23B is composed of the first capacitor electrode 23B1 provided in the SD electrode layer 112 which is the first electrode layer and the second capacitor electrode 23B2 provided in the GM electrode layer 111 which is the second electrode layer. The first capacitor electrode 23B1 and the second capacitor electrode 23B2 are opposite to each other in the stacking direction. In addition, the backup capacitor element 23P is composed of a first backup capacitor electrode 23P1 provided in the SD electrode layer 112 which is the first electrode layer, and a second backup capacitor electrode 23P2 provided in the GM electrode layer 111 which is the second electrode layer. The first backup capacitor electrode 23P1 and the second backup capacitor electrode 23P2 are opposite to each other in the stacking direction.

Here, the SD electrode layer 112 is a source/drain electrode layer of the drive transistor 22 in FIG. 2, and the GM electrode layer 111 is a gate electrode layer of the drive transistor 22 in FIG. 2. With this, upon composing the capacitor unit 23 according to the embodiment 1, it is not necessary to stack an electrode layers separately. Instead, the electrode layer used for the drive transistor which is the existing component is used, thereby reducing the area for the pixel circuit and simplifying the fabrication process.

The first capacitor electrodes 23A1 and 23B1 are electrically connected to the power line 16 which is the first line, and the second capacitor electrodes 23A2 and 23B2 are electrically connected to a line 111L which is the second line. The second backup capacitor electrode 23P2 is electrically connected to the power line 16 which is the first line via the contact hole.

A region $D_A$ includes a disconnect-able portion at which the electric connection between the second capacitor electrode 23A2 and the line 111L can be disconnected, and a connectable portion at which the electric connection between the first backup capacitor electrode 23P1 and the line 111L can be electrically connected. More specifically, the disconnect-able portion and the connectable portion are provided at an overlapping position in the stacking direction in the region $D_A$.

A region $D_B$ includes a disconnect-able portion at which the electric connection between the second capacitor electrode 23B2 and the line 111L can be disconnected, and a connectable portion at which the electric connection between the first backup capacitor electrode 23P1 and the line 111L can be electrically connected. More specifically, the disconnect-able portion and the connectable portion are provided at an overlapping position in the stacking direction in the region $D_B$.

Note that, the material for the SD electrode layer 112 and the GM electrode layer 111 is, for example, an alloy of molybdenum (Mo) and Tungsten (W), or a stacked structure of the alloy of Mo and W/aluminium (Al)/an alloy of Mo and W, and the thickness is 150 nm, for example. An interlayer insulating film is formed between the SD electrode layer 112 and the GM electrode layer 111. The interlayer insulating film is, for example, a silicon oxide film (SiOx) or a silicon nitride film (SiN). The thickness of the insulating layer is 150 nm, for example. Note that, the insulating layer may be a dielectric material for securing desired capacitance.

Figure 4A:
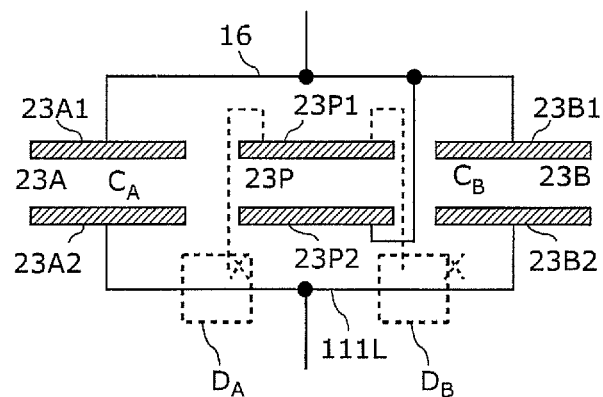
FIG. 4A is an equivalent circuit diagram of the capacitor unit included in the light-emitting pixel according to the embodiment 1, which does not require repair.

FIG. 4A is an equivalent circuit diagram illustrating the capacitor unit included in the light-emitting pixel according to the embodiment 1 which does not require repair. When the capacitor elements 23A and 23B are not short-circuited, the capacitance of the capacitor unit 23 is a sum of the capacitance of the capacitor elements 23A and 23B ($C_A+C_B$). Here, in the backup capacitor element 23P, the second backup capacitor electrode 23P2 is connected to the power line 16, and the first backup capacitor electrode 23P1 is not connected to any line or electrode. Accordingly, in the light-emitting pixel which does not require repair, the backup capacitor element 23P does not function as a capacitor element.

Here, in the embodiment 1, when the capacitor elements 23A and 23B are short-circuited, it is possible to disable the capacitor having the short-circuited part. More specifically, the disconnect-able portion and the connectable portion are irradiated with the laser from a direction substantially vertical to the surface of the film.

Figure 3B:
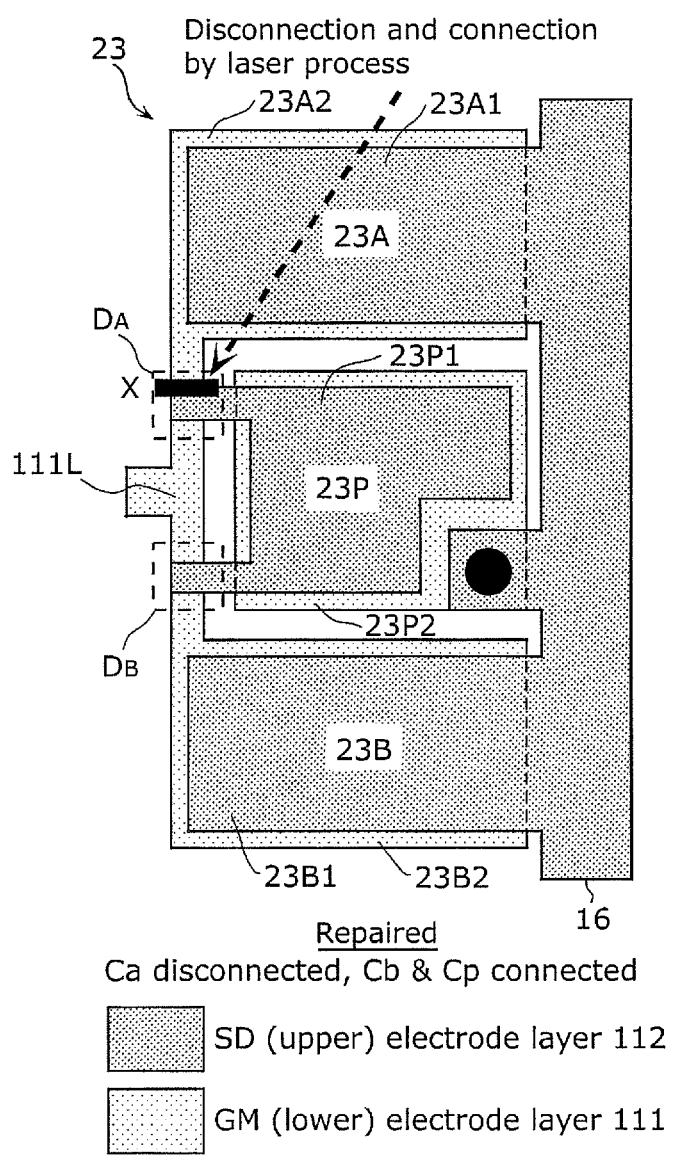
FIG. 3B is a top perspective view illustrating a first example of electrode configuration of the capacitor unit included in the repaired light-emitting pixel according to the embodiment 1.

FIG. 3B is a top perspective view illustrating the first example of the electrode configuration of the capacitor unit included in the repaired light-emitting pixel according to the embodiment 1. In FIG. 3B, a case in which the capacitor element 23A is short-circuit is illustrated, and the basic configuration of the capacitor unit 23 is identical to the capacitor unit 23 included in the light-emitting pixel which does not require repair, illustrated in FIG. 3A. In this case, the connection between the second capacitor electrode 23A2 and the line 111L is blocked by irradiating the disconnect-able portion and the connectable portion (X in FIG. 3B) in the region $D_A$ with the laser, and connecting the first backup capacitor electrode 23P1 and the line 111L.

Figure 4B:
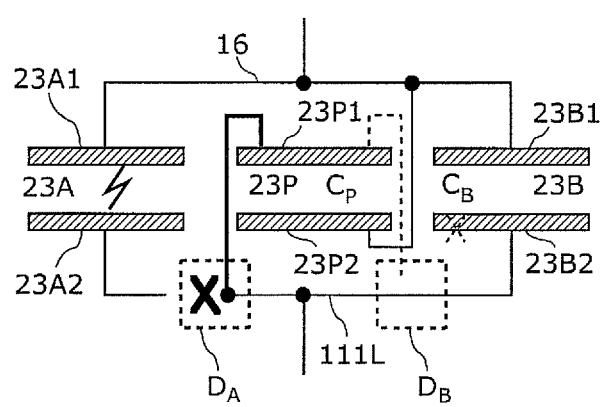
FIG. 4B is an equivalent circuit diagram illustrating a first example of the capacitor unit included in the repaired light-emitting pixel according to the embodiment 1.

FIG. 4B is an equivalent circuit diagram of the first example of the capacitor unit included in the light-emitting pixel which does not require repair according to the embodiment 1 of the present invention. When the capacitor element 23A is short-circuited, the capacitance of the capacitor unit 23 is a sum of the capacitance of the capacitor elements 23B and 23P ($C_B+C_P$), by the laser irradiation on the region $D_A$. Here, the first backup capacitor electrode 23P1 in the backup capacitor element 23P is connected to the line 111L. On the other hand, the second capacitor electrode 23A2 in the capacitor element 23A is disconnected from the line 111L. Accordingly, in the repaired light-emitting pixel, the capacitor element 23A does not function as the capacitor element.

Therefore, the capacitance of the repaired capacitor unit 23 changes from the original capacitance ($C_A+C_B$) to the capacitance ($C_B+C_P$). Here, by setting the capacitance of the backup capacitor element and the capacitance of the capacitor element identical makes the repaired light-emitting pixel 11 possible to hold a voltage corresponding to the signal voltage from the signal line 12 and causes the display element layer 11B to emit light with normal light-emission timing.

Figure 3C:
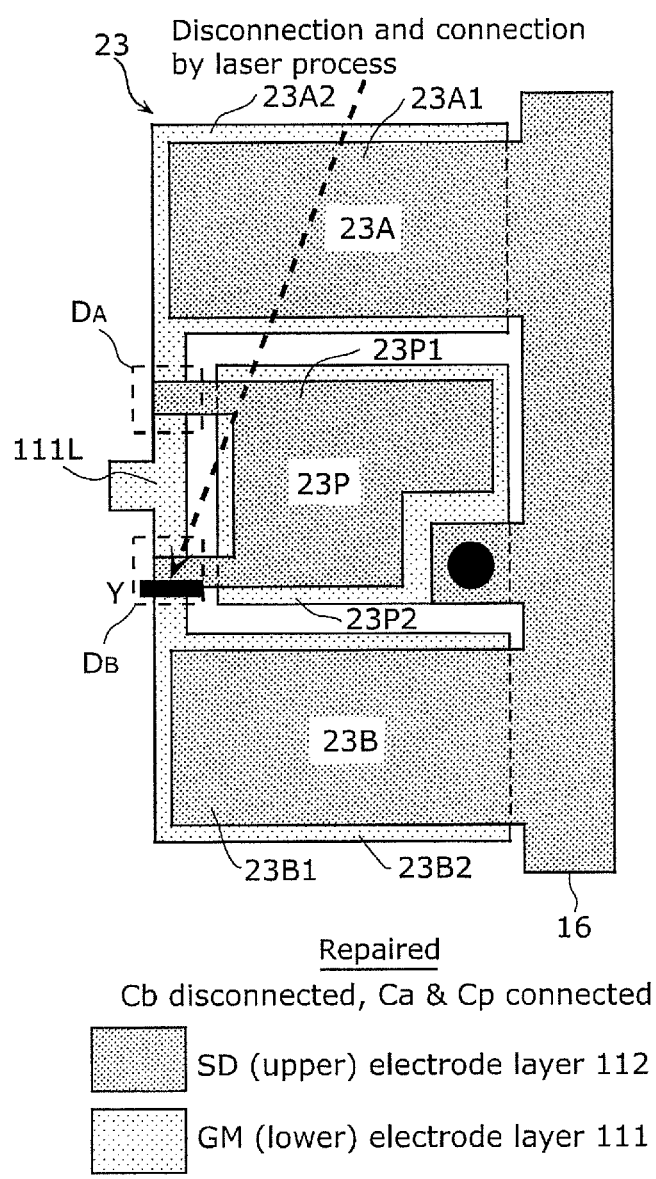
FIG. 3C is a top perspective view illustrating a second example of electrode configuration of the capacitor unit included in the repaired light-emitting pixel according to the embodiment 1.

FIG. 3C is a top perspective view illustrating the second example of the electrode configuration of the capacitor unit included in the repaired light-emitting pixel according to the embodiment 1. In FIG. 3C, a case in which the capacitor element 23B is short-circuited is illustrated, and the basic configuration of the capacitor unit 23 is identical to the capacitor unit included in the light-emitting pixel which does not require repair illustrated in FIG. 3A. In this case, the second capacitor electrode 23B2 and the line 111L are blocked and the first backup capacitor electrode 23P1 and the line 111L are connected by irradiating the disconnect-able portion and the connectable portion (Y in FIG. 3C) in the region $D_B$ with the laser.

Figure 4C:
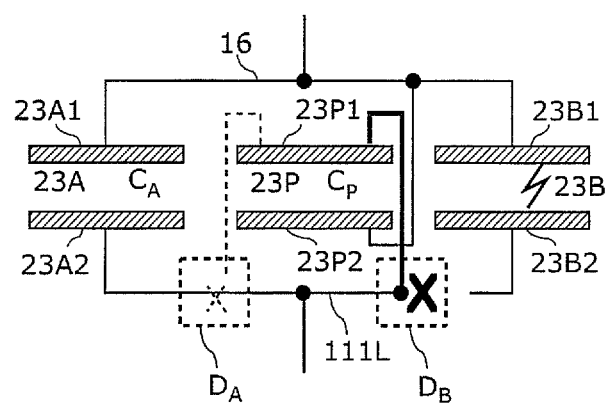
FIG. 4C is an equivalent circuit diagram illustrating a second example of the capacitor unit included in the repaired light-emitting pixel according to the embodiment 1.

FIG. 4C is an equivalent circuit diagram of the second example of the capacitor unit included in the light-emitting pixel which does not require repair according to the embodiment 1 of the present invention. When the capacitor element 23B is short-circuited, the capacitance of the capacitors 23A and 23P is a sum of the capacitance of the capacitor elements 23A and 23P ($C_A+C_P$) after the laser irradiation on the region $D_B$. Here, the first backup capacitor electrode 23P1 in the backup capacitor element 23P is connected to the line 111L. The second capacitor electrode 23B2 in the capacitor element 23B is disconnected from the line 111L. Accordingly, in the light-emitting pixel after repair, the capacitor element 23B does not function as a capacitor element.

Therefore, the capacitance of the repaired capacitor unit 23 changes from the original capacitance ($C_A+C_B$) to the capacitance ($C_A+C_P$). Here, by setting the capacitance of the backup capacitor element and the capacitance of the capacitor element identical makes the repaired light-emitting pixel 11 possible to hold a voltage corresponding to the signal voltage from the signal line 12 and causes the display element layer 11B to emit light with normal light-emission timing.

Next, the change in the shape of the disconnect-able portion and the connectable portion due to laser irradiation shall be described.

Figure 5:
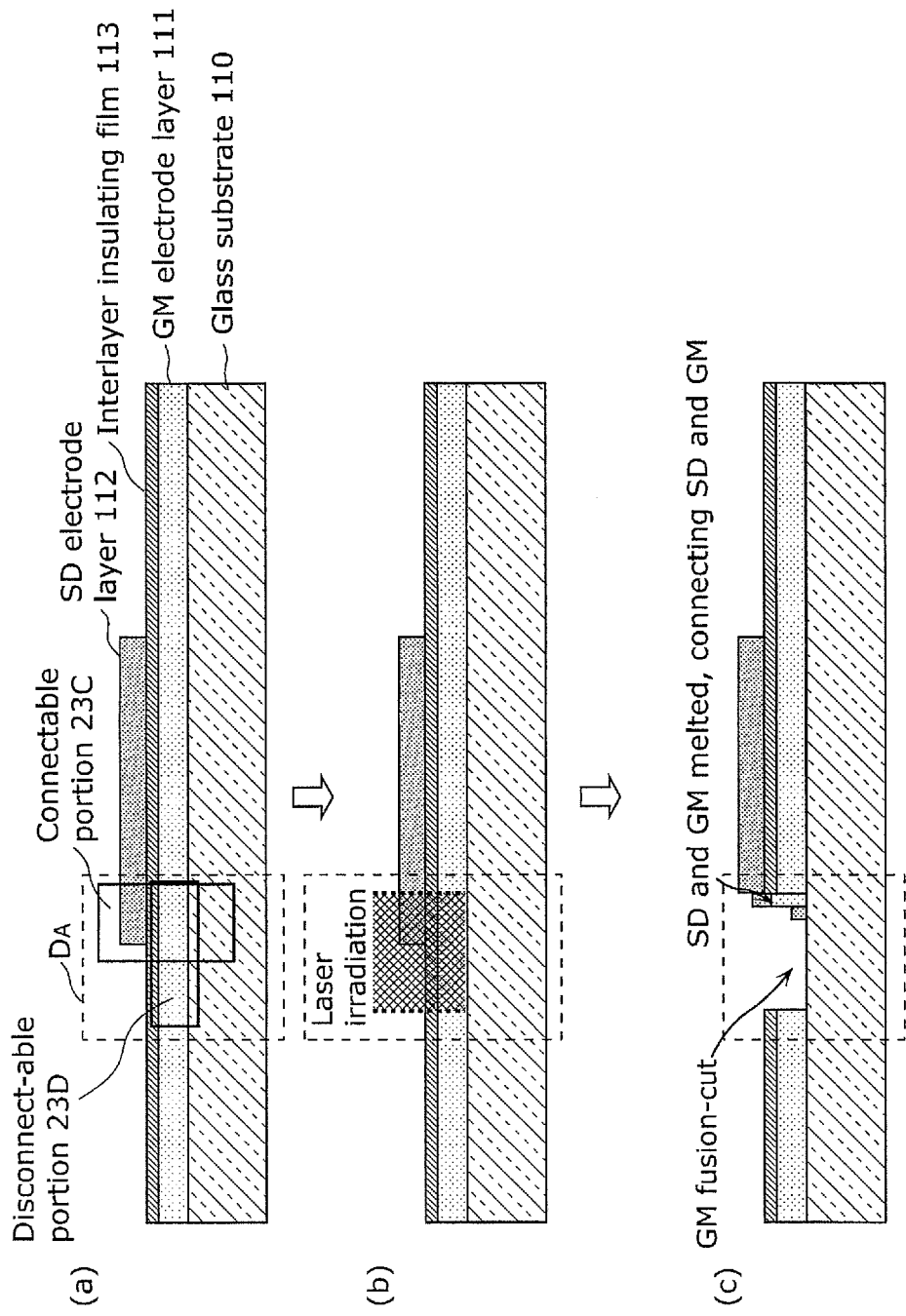
FIG. 5 is a schematic cross-sectional view illustrating an electrode layer, the shape of which changes by laser irradiation.

FIG. 5 is a schematic cross-sectional view illustrating an electrode layer, the shape of which changes by the laser irradiation. The schematic cross-sectional configuration of the region $D_A$ and its periphery in the drive circuit layer 11A is illustrated in (a) to (c) in FIG. 5. As illustrated in FIG. 5, the capacitor is formed on the glass substrate 110 by stacking a GM electrode layer 111, an interlayer insulating film 113, and an SD electrode 112 in this order, for example. Here, the end portion of the SD electrode layer 112 configures the connectable portion 23C, and the overlapping portion of the GM electrode layer 111 overlapping with the connectable portion 23C in the stacking direction configures the disconnect-able portion 23D.

As illustrated in (b) in FIG. 5, the region $D_A$ is irradiated with the laser in a substantially vertical direction with respect to the film surface. With this, as illustrated in (c) in FIG. 5, the end portion of the SD electrode layer 112 melts and welded to the GM electrode layer 111, and the line composed of the GM electrode layer 111 is fusion-cut.

As described above, the laser irradiation on the disconnect-able portion 23D and the connectable portion 23C can connect the connectable portion 23C and disconnect the disconnect-able portion 23D by one laser irradiation.

Next, the changes in the shape of the disconnect-able portion 23D and the connectable portion 23C by the laser irradiation shall be described in more detail while clearly explaining the connection between the capacitor elements 23A and 23B and the backup capacitor element 23P.

Figure 6:
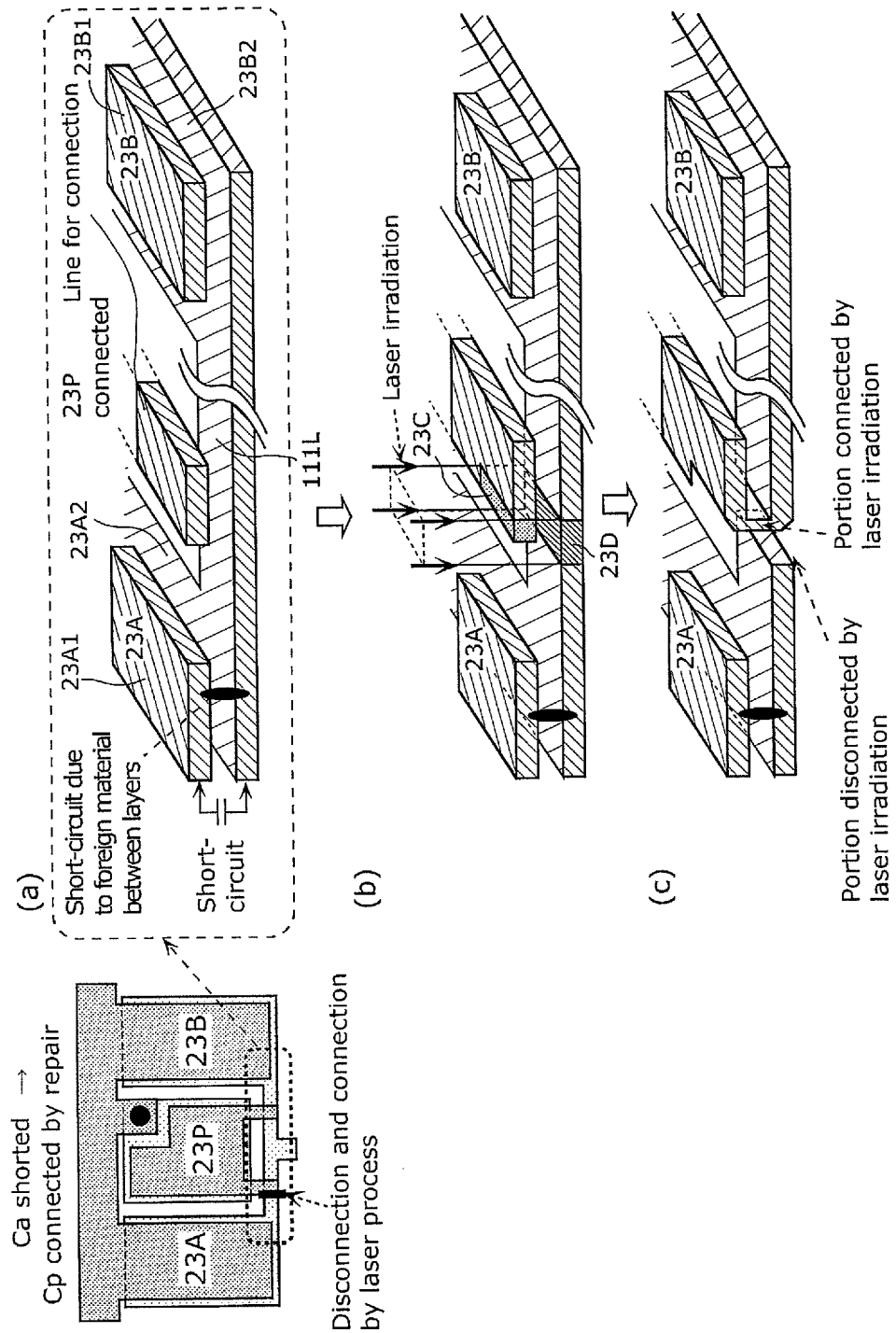
FIG. 6 is a perspective view of the capacitor connecting portion illustrating the re-configuration of the capacitor electrode and line by the laser irradiation.

FIG. 6 is a perspective view of the capacitor connecting portion illustrating the re-configuration of the capacitor electrode and line by the laser irradiation. In FIG. 6, the capacitor element and the portion for connecting the backup capacitor element in the light-emitting pixel that require repair illustrated in FIG. 3B are illustrated.

As illustrated in (b) in FIG. 6, the connectable portion 23C and the disconnect-able portion 23D are irradiated with the laser in the substantially vertical direction. The connectable portion 23C is an end portion of the line for connection extended from the first backup capacitor electrode 23P1, and the disconnect-able portion 23D is on the line 111L and overlaps with the connectable portion 23C in the stacking direction. Here, the disconnect-able portion 23D is provided on the line connecting the second capacitor electrode 23A2 and the line 111L, and has a shape that allows fusion-cutting of the connection between the second capacitor electrode 23A2 and the line 111L by the laser irradiation. The connectable portion 23C includes a line for connection extended from the first backup capacitor electrode 23P1 to a position overlapping the disconnect-able portion 23D, and has a shape that is allows connection of the second capacitor electrode 23A2 and the disconnected line 111L, and the line for connection by laser irradiation.

With this, as illustrated in (c) in FIG. 6, part of the line for connection melts and is connected to the line 111L in the connectable portion 23C, and the disconnect-able portion 23D of the line 111L is fusion-cut, disconnecting the second capacitor electrode 23A2 and the line 111L. Therefore, with regard to the disconnect-able portion 23D and the connectable portion 23C, the disconnect-able portion 23D is disconnected, and the connectable portion 23C is connected by one laser irradiation.

Furthermore, since only the line for connection extended from the first backup capacitor electrode 23P1 and the line 111L connecting the capacitor electrodes are irradiated with the laser, highly accurate repair processing without damaging the backup capacitor electrode and the capacitor electrode is possible.

Note that, the end surface of the line for connection is preferably in parallel with the stacking direction above the disconnect-able portion 23D. With this, when the end portion of the line for connection melts by the laser irradiation, the area of the end surface of the line for connection which is the connecting part to the line 111L is secured. With this, the first backup capacitor electrode 23P1 and the line 111L can be securely welded via the line for connection.

As described above, when there is a malfunction in the capacitor element 23A, and repair for changing the electric connection from the capacitor element 23A to the backup capacitor element 23P is performed, the capacitor element 23A can be disconnected and the backup capacitor element 23P can be connected with one processing, since the disconnect-able portion 23D and the connectable portion 23C are provided at a position overlapping in the stacking direction in the display device 1 according to the present invention. With this, it is possible to suppress the area of the region to be processed to the minimum, and the number of repair processes is reduced. Therefore, it is possible to simplify the fabrication process and reduce the area while maintaining the capacitance held.

Note that, the line for connection in the connectable portion 23C and the line 111L in the disconnect-able portion 23D are 4 μm in line width, and have shapes that allows welding and fusion-cutting by the laser irradiation. Here, the shape that allows welding and fusion-cutting is closely related to the specification of the laser to be used. For example, a laser having a wavelength of 532 nm, a pulse width of 10 ns, and a power of 0.5 mW using a laser oscillator having a Yttrium Aluminium Garnet (YAG) laser as the light source. In this case, if the shape of the line for connection and the line 111L is the shape described above, the line for connection and the line 111L are welded and fusion-cut without damaging the other normal capacitor element and the lines.

Figure 7:
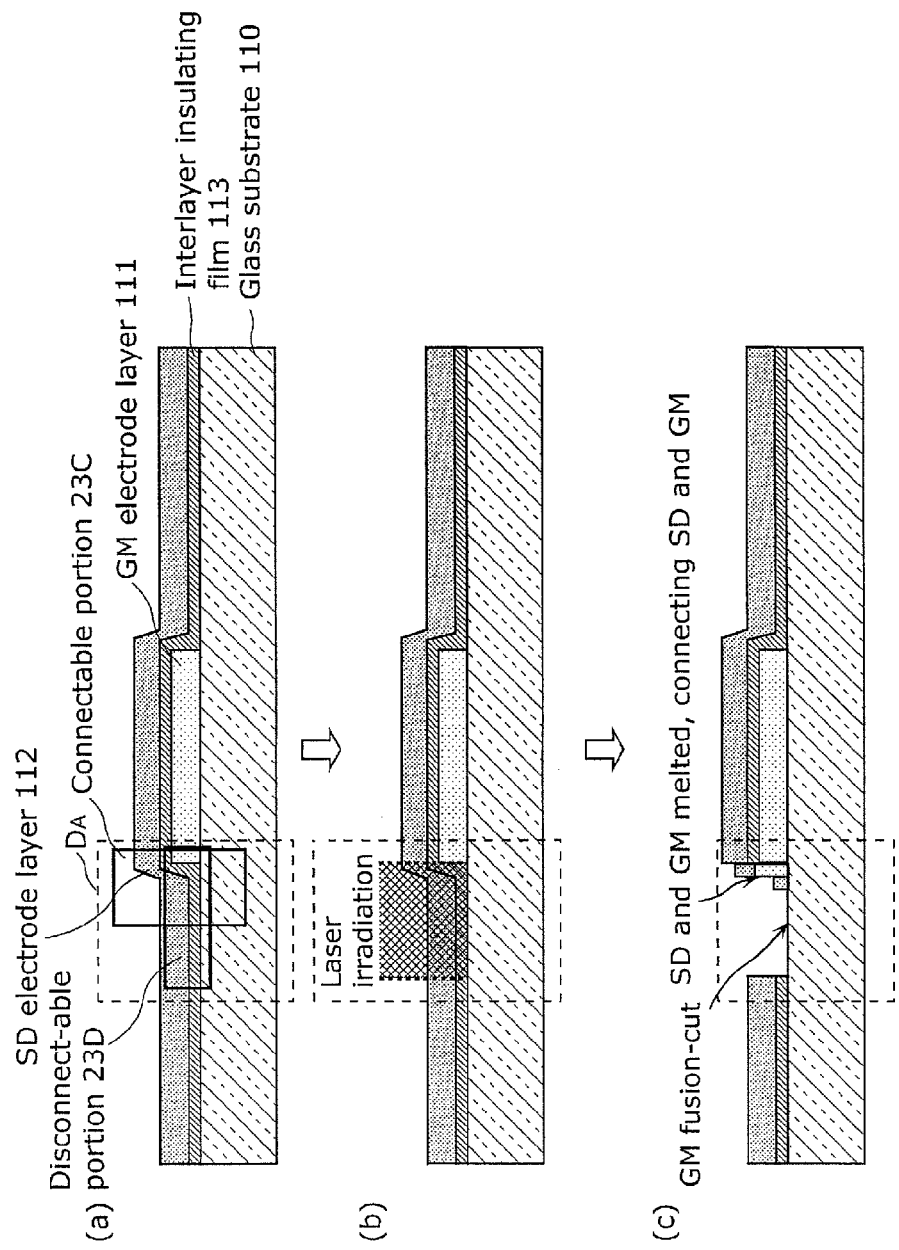
FIG. 7 is a schematic cross-sectional view illustrating an electrode layer, the shape of which changes by laser irradiation.

FIG. 7 is a schematic cross-sectional view illustrating a variation of an electrode layer, the shape of which changes by the laser irradiation. The schematic cross-sectional configuration of the region $D_A$ and its periphery in the drive circuit layer 11A is illustrated in (a) to (c) in FIG. 7. As illustrated in FIG. 7, the capacitor is formed on the glass substrate 110 by stacking a GM electrode layer 111, an interlayer insulating film 113, and an SD electrode 112 in this order, for example. Compared to the stacked structure of the electrode layer illustrated in FIG. 5, the stacked structure of the electrode layer in FIG. 7 includes the interlayer insulating film 113 and the SD electrode layer 112 covering the patterned GM electrode layer 111.

Here, the end portion of the GM electrode layer 111 and the SD electrode layer 112 immediately above the end portion composes the connectable portion 23C, and the overlapping portion of the SD electrode layer 112 overlapping with the connectable portion 23C in the stacking direction composes the disconnect-able portion 23D. More specifically, the disconnect-able portion 23D is provided on the line connecting the second capacitor electrode provided in the SD electrode layer 112 and the second line, and has a shape allowing the fusion-cutting of the connection between the second capacitor electrode and the second line by laser irradiation. In addition, the connectable portion 23C includes a line for connection extended from the first backup electrode provided in the GM electrode layer 111 to a position overlapping with the disconnect-able portion 23D, and has a shape which allows welding of the line for connection and the second line disconnected from the second capacitor electrode by laser irradiation.

As illustrated in (b) in FIG. 7, the region $D_A$ is irradiated with the laser in a substantially vertical direction. With this, as illustrated in (c) in FIG. 7, the connectable portion 23C in the SD electrode layer 112 melts and welded to the GM electrode layer 111, and the line composed of the disconnect-able portion 23D in the SD electrode layer 112 is fusion-cut.

As described above, with the laser irradiation on the disconnect-able portion 23D and the connectable portion 23C can connect the connectable portion 23C and disconnect the disconnect-able portion 23D by one laser irradiation in this variation as well.

(Embodiment 2)

In the embodiment 2, a fabrication method for a display device according to the present invention shall be described. The fabrication method for the display device according to the present invention includes a process of forming the drive circuit layer, a process of forming a display element layer, a process of testing a pixel circuit, and a process of repairing a capacitor unit. Here, a process different from the conventional fabrication method for display device, that is, a process for forming the capacitor unit 23 included in the drive circuit layer, a process of testing the pixel circuit, and the process of repairing the pixel circuit shall be mainly described.

Figure 8:
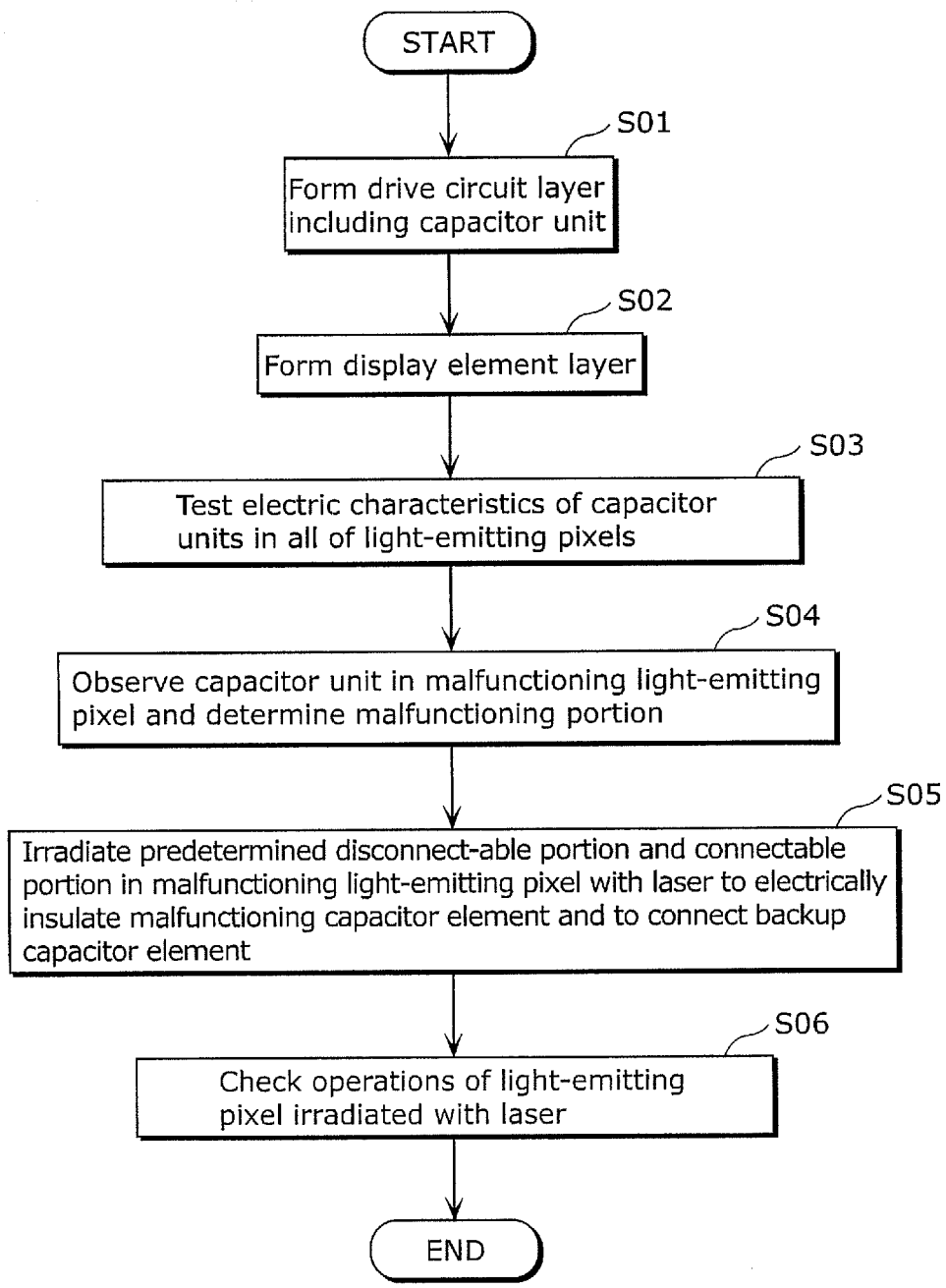
FIG. 8 is an operational flowchart illustrating the fabrication method for the display device according to the embodiment 2 of the present invention.

FIG. 8 is an operational flowchart illustrating the fabrication method for the display device according to the embodiment 2 of the present invention.

First, the drive circuit layer 11A in which the capacitor element 23 and elements around the capacitor element 23, namely, a switching transistor 21, a drive transistor 22, and lines are appropriately arranged is formed (S01).

More specifically, a GM electrode layer 111 made of an alloy of Mo and W, for example, is formed in a shape illustrated in FIG. 3A, as a layer of the drive circuit layer 11A illustrated in FIG. 2, by methods such as metal mask forming, liftoff, or etching. Next, an interlayer insulating film 113 made of SiOx, SiN, or others on the GM electrode layer 111 so as to cover the GM electrode layer 111. Here, it is preferable to planarize the surface of the interlayer insulating layer 113 as necessary. Next, on the interlayer insulating film 113, an SD electrode layer 112 is formed in a shape illustrated in FIG. 3A, using methods such as metal mask forming, liftoff, etching and others. The SD electrode layer 112 is made of a stacked structure of an alloy of Mo and W/Al/and the alloy of Mo and W. Step S01 corresponds to the drive circuit forming step.

Next, on the drive circuit layer 11A, a display element layer 11B including an organic EL element layer 24 is formed after the planarizing process for the drive circuit layer 11A (S02).

More specifically, the display element layer 11B includes an anode, a hole injection layer, a hole transport layer, an organic light-emitting layer, a bank layer, an electron injecting layer, and a transparent cathode. Step S02 corresponds to the display element forming step.

Next, for all of the light-emitting pixels 11, the electric characteristics of the capacitor units 23 are tested, and the light-emitting pixel 11 which includes short-circuited capacitor unit 23 is identified (S03).

More specifically, for example, an array tester (HS100 by Agilent Technologies) is connected to the signal line 12, and a test voltage is sequentially output to the light-emitting pixel 11 via the signal line 12 so as to write the voltage on the capacitor unit 23. After that, the array tester reads the voltage written on the capacitor unit 23 through the signal line 12 with predetermined timing. With this, the light-emitting pixel 11 with a read voltage less than the predetermined voltage is identified. This completes the process of identifying the light-emitting pixel including malfunctioning capacitor unit 23.

Next, the capacitor unit 23 in the identified light-emitting pixel 11 is observed to determine the malfunctioning region (S04).

More specifically, for example, the shape of unevenness at the surface of the region in which the capacitor unit 23 is formed by a microscope, for example. A region in which conductive particles are eccentrically-located usually has a convex shape. With this, the process of determining the area of malfunctioning capacitor unit 23 is completed, identifying the malfunctioning capacitor. Note that, this area determining process may be performed by an inspector, or by an automated measurement having image recognition function. Steps S03 and S04 correspond to the testing step.

Next, the predetermined disconnect-able portion 23D and the connectable portion 23C in the capacitor unit 23 including the identified malfunctioning capacitor element is irradiated with laser for electrically insulating the capacitor element from the pixel circuit element, and for connecting the backup capacitor element to the pixel circuit element (S05). Step S05 corresponds to the repairing step.

Finally, the operation of the light-emitting pixel 11 irradiated with laser as described above is checked (S06).

With the fabrication method described above, when a malfunction is found in the capacitor element, and a repair for changing the electric connection from the capacitor element to the backup capacitor element is performed, it is possible to disconnect the capacitor element and connect the backup capacitor element by processing one part, since the disconnect-able portion 23D and the connectable portion 23C are provided at a position overlapping with each other in the stacking direction. With this, it is possible to reduce the number of processes for fabrication, and suppress the area for repair processing to the minimum.

Note that, the testing steps S03 and S04, and the repairing step S05 may be performed before the display element forming step S02. In other words, the steps may be performed after the SD electrode layer 112 is formed, after the planarizing process for the drive circuit layer 11A, or after the sealing process for the display element layer 11B.

In addition, after the repair step S05, a reinforcing step for reinforcing the connection by the connectable portion 23C by adding low resistance metal material in the connectable portion 23C. As a method for adding the low resistance metal material includes spraying gold particles by the inkjet method, and laser annealing the connectable portion 23C after spraying.

With this, it is possible to increase the conductivity of the connection between the first backup capacitor electrode and the second line implemented by laser irradiation in the connectable portion 23C. This increases certainty of repair, increasing fabrication yield.

(Embodiment 3)

In the embodiment 3, the layout of the light-emitting pixel 11 according to the embodiment 1, and the effect of the configuration shall be described.

Figure 9A:
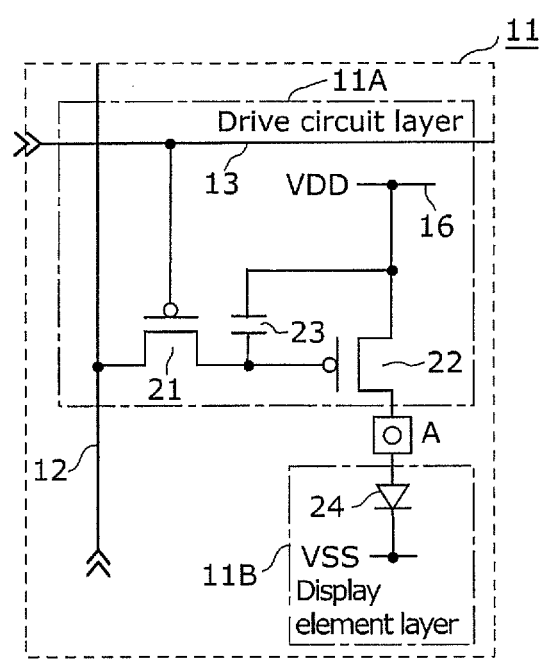
FIG. 9A is a diagram illustrating the circuit configuration of the light-emitting pixel included in the display device according to the embodiment 3.

FIG. 9A is a circuit configuration diagram of the light-emitting pixel included in the display device according to the embodiment 3. Since the circuit configuration of the light-emitting pixel in FIG. 9A is identical to the circuit configuration of the light-emitting pixel 11 illustrated in FIG. 2, the description for the circuit configuration shall be omitted.

Figure 9B:
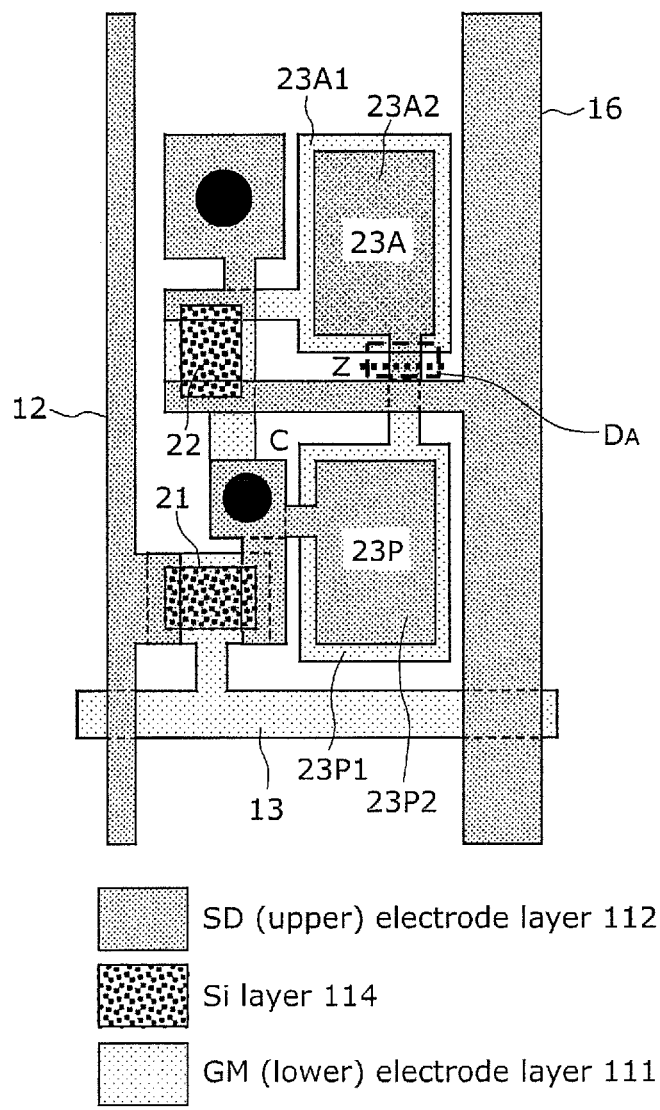
FIG. 9B is a layout chart of the light-emitting pixel included in the display device according to the embodiment 3.

FIG. 9B is a layout diagram for the light-emitting pixel included in the display device according to the embodiment 3. The layout illustrated in FIG. 9B is a layout for one light-emitting pixel, and includes a signal line 12, a scanning line 13, a power line 16, a switching transistor 21, a drive transistor 22, a capacitor element 23A, and a backup capacitor element 23P. The switching transistor 21 and the drive transistor 22 are bottom-gate transistors. The layer in which the gate electrode is formed is the GM electrode layer 111, and the layer in which the source electrode and the drain electrode are formed is the SD electrode layer 112.

The capacitor unit 23 includes one capacitor element 23A and one backup capacitor element 23P.

The capacitor element 23A in the capacitor unit 23 includes a first capacitor electrode 23A1 provided in the GM electrode layer 111 which is the first electrode layer, and a second capacitor electrode 23A2 provided in the SD electrode layer 112 which is the second electrode layer. The first capacitor electrode 23A1 and the second capacitor electrode 23A2 are opposite to each other in the stacking direction. In addition, the backup capacitor element 23P is composed of a first backup capacitor electrode 23P1 provided in the GM electrode layer 111 which is the first electrode layer, and a second backup capacitor electrode 23P2 provided in the SD electrode layer 112 which is the second electrode layer. The first backup capacitor electrode 23P1 and the second backup capacitor electrode 23P2 are opposite to each other in the stacking direction.

In addition, the first capacitor electrode 23A1 is electrically connected to the GM electrode layer 111 in the drive transistor 22 which is the first line, and the second capacitor electrode 23A2 is electrically connected to the power line 16 which is the second line. In addition, the second backup capacitor electrode 23P2 is electrically connected to the GM electrode layer 111 in the drive transistor 22 which is the first line via a contact hole C.

In addition, the region $D_A$ includes a disconnect-able portion at which the electric connection between the second capacitor electrode 23A2 and the power line 16 can be disconnected, and a connectable portion at which the first backup capacitor electrode 23P1 and the power line 16 can be electrically connected. More specifically, the disconnect-able portion and the connectable portion are provided at an overlapping position in the stacking direction.

Here, when the capacitor element 23A is malfunctioning due to short-circuit in the fabrication process for the drive circuit layer 11A, the connection between the second capacitor electrode 23A2 and the power line 16 is blocked and the first backup capacitor electrode 23P1 and the power line 16 are connected by irradiating the disconnect-able portion and the connectable portion in the region $D_A$ (Z in FIG. 9B) with laser.

With the layout described above, the capacitance of the repaired capacitor unit 23 changes from the original capacitance $C_A$ to the capacitance $C_P$. Here, since the capacitance of the backup capacitor element and the capacitance of the capacitor element are set to be identical, the repaired light-emitting pixel 11 can hold a voltage corresponding to the signal voltage from the signal line 12, and can cause the display element layer 11B to emit light with normal timing for emitting light.

In addition, in the pixel circuit according to the embodiment 3, the GM electrode layer 111 in which the gate electrode of the drive transistor 22 is provided and the SD electrode layer 112 in which the source electrode of the switching transistor 21 is provided is connected via the contact hole C. More specifically, the electrode layers are reversed between the gate electrode of the drive transistor 22 and the source electrode of the switching transistor 21. On the other hand, in order to make the disconnect-able portion and the connectable portion which are the major parts of the present invention overlapped with each other, the second capacitor electrode 23A2 in the capacitor element 23A and the power line 16 are connected before repair, and the first backup capacitor electrode 23P1 in the backup capacitor element 23P and the power line 16 are connected after repair. More specifically, in the capacitor element 23A and the backup capacitor element 23P, the electrode layers are reversed. With this, the first capacitor electrode 23A1 in the capacitor element 23A and the GM electrode layer 111 can be connected before repair, and the second backup capacitor electrode 23P2 in the backup capacitor element 23P and the SD electrode layer 112 can be connected after repair. With this, the configuration of the connection between the capacitor element 23A and the backup capacitor element 23P according to the present invention allows the electrode layers to be reversed in the connection between the drive transistor 22 and the switching transistor 21.

As described above, according to the layout of the pixel circuit according to the embodiment 3, when the malfunction is found in the capacitor element 23A, and the capacitor unit 23 is repaired by changing the electric connection from the capacitor element 23A to the backup capacitor element 23P, in the display device according to the present invention, the disconnect-able portion and the connectable portion are provided overlapping with each other in the stacking direction. Thus, the disconnection of the capacitor element 23A and the connection of the backup capacitor element 23P may be performed by processing one part. With this, it is possible to suppress the area of the region to be processed to the minimum, and the number of repair processes is reduced. Therefore, it is possible to simplify the fabrication process and reduce the area while maintaining the capacitance.

(Embodiment 4)

In the embodiment 4, the layout of the light-emitting pixel 31 different from the embodiment 1, and the effect of the configuration shall be described.

Figure 10A:
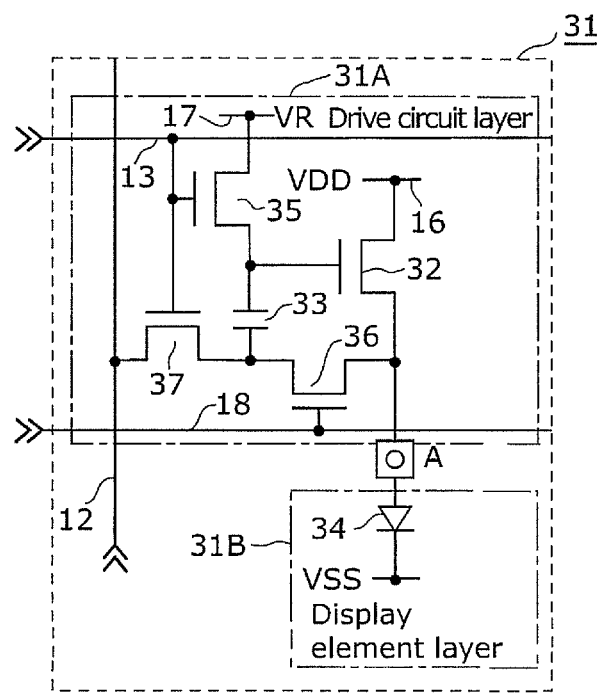
FIG. 10A is a diagram illustrating the circuit configuration of the light-emitting pixel included in the display device according to the embodiment 4.

FIG. 10A is a diagram illustrating the circuit configuration of the light-emitting pixel included in the display device according to the embodiment 4. The light-emitting pixel 31 in FIG. 2 includes a drive circuit layer 31A and the display element layer 31B. The drive circuit layer 11A includes switching transistors 35, 36, and 37, a drive transistor 32, and a capacitor unit 33. The drain electrode of the switching transistor 37 is connected to the signal line 12, the gate electrode of the switching transistor 37 is connected to a scanning line 13, and the source electrode of the switching transistor 37 is connected to the capacitor unit 33 and the drain electrode of the switching transistor 36. The source electrode of the drive transistor 32 is connected to the anode of the organic EL element 34 via the connecting point A. The gate electrode of the drive transistor 32 is connected to the capacitor unit 33 and the source electrode of the switching transistor 35.

With the circuit configuration described above, it is possible to record accurate electric potential according to the signal voltage at the electrodes at the ends of the capacitor unit 33.

Figure 10B:
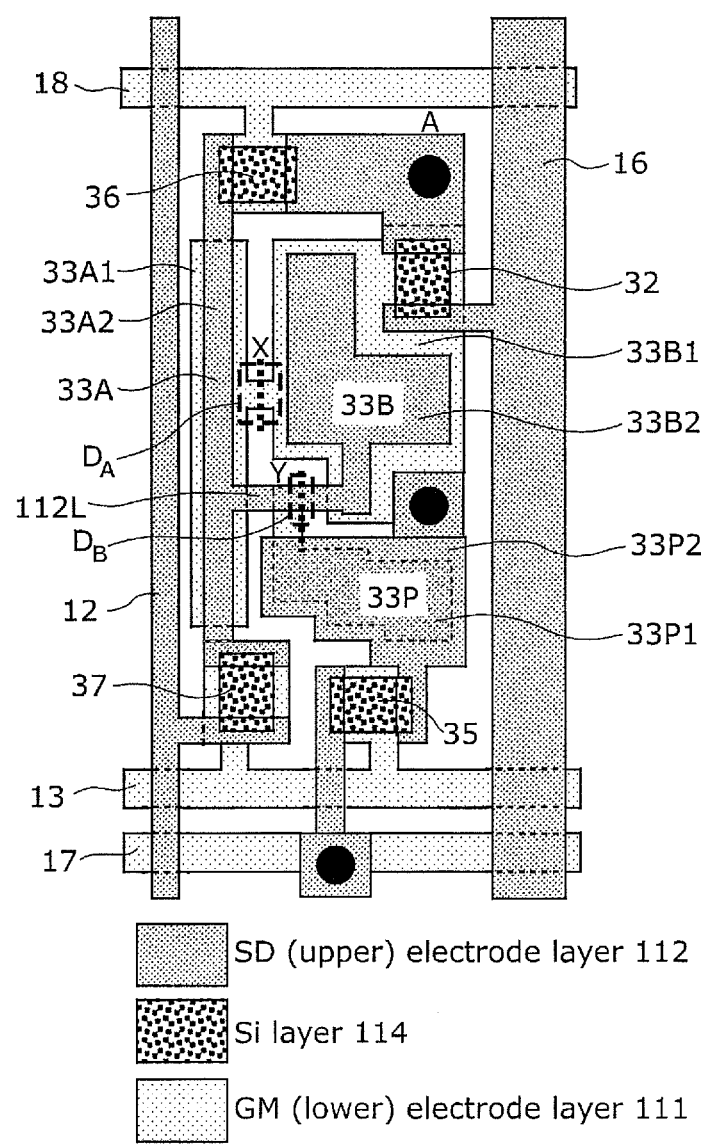
FIG. 10B is a layout chart of the light-emitting pixel included in the display device according to the embodiment 4.

FIG. 10B is a layout chart of the light-emitting pixel included in the display device according to the embodiment 4. The layout illustrated in FIG. 10B is a layout for one light-emitting pixels, and include the signal line 12, the scanning lines 13 and 18, the power line 16, the reference power line 17, the switching transistors 35, 36, and 37, the drive transistor 32, the capacitor elements 33A and 33B, and the backup capacitor element 33P. The switching transistors 35, 36, and 37, and the drive transistor 32 are bottom-gate transistors, the layer in which the gate electrode is formed is the GM electrode layer 111, and the layer in which the source electrode and the drain electrode are formed is the SD electrode layer 112.

The capacitor unit 33 is composed of the two capacitor elements 33A and 33B, and one backup capacitor element 33P.

The capacitor element 33A in the capacitor unit 33 includes a first capacitor electrode 33A1 provided in the GM electrode layer 111 which is the first electrode layer, and a second capacitor electrode 33A2 provided in the SD electrode layer 112 which is the second electrode layer. The first capacitor electrode 33A1 and the second capacitor electrode 33A2 are opposite to each other in the stacking direction. The capacitor element 33B is composed of the first capacitor electrode 33B1 provided in the GM electrode layer 111 which is the first electrode layer, and the second capacitor electrode 33B2 provided in the SD electrode layer 112 which is the second electrode layer. The first capacitor electrode 33B1 and the second capacitor electrode 33B2 are opposite to each other in the stacking direction. In addition, the backup capacitor element 33P is composed of a first backup capacitor electrode 33P1 provided in the GM electrode layer 111 which is the first electrode layer, and a second backup capacitor electrode 33P2 provided in the SD electrode layer 112 which is the second electrode layer. The first backup capacitor electrode 33P1 and the second backup capacitor electrode 33P2 are opposite to each other in the stacking direction.

The first capacitor electrodes 33A1 and 33B1 are electrically connected to the GM electrode layer 111 in the drive transistor 32, which is the first line, and the second capacitor electrodes 33A2 and 33B2 are electrically connected to the line 112L which is the second line. In addition, the second backup capacitor electrode 33P2 is electrically connected to the GM electrode layer 111 in the drive transistor 22, which is the first line via a contact hole.

The region $D_B$ includes a disconnect-able portion at which the electric connection between the second capacitor electrode 33B2 and the line 112L can be disconnected (Y in FIG. 10B), and the connectable portion at which the first backup capacitor electrode 33P1 and the line 112L can be electrically connected (Y in FIG. 10B). More specifically, the disconnect-able portion and the connectable portion are provided at an overlapping position in the stacking direction.

In contrast, the region $D_A$ is a disconnect-able portion at which the electric connection between the first capacitor electrode 33A1 and the first capacitor electrode 33B1 (X in FIG. 10B) can be disconnected, but does not function as a connectable portion.

The area ratio of the capacitor elements 33A, 33B, and the backup capacitor element 33P is 1:2:1.

Here, when the capacitor unit 33A malfunctions due to short circuit in the fabrication process for the drive circuit layer 11A, the connection between the first capacitor electrode 33A1 and the first capacitor electrode 33B1 are blocked by irradiating the disconnect-able portion in the region $D_A$ (X in FIG. 10B) with laser. With this, the capacitor element 33A is disconnected, and the backup capacitor element 33P is not connected. As a result, the capacitance of the capacitor unit 33 is reduced to two-thirds of the capacitance of the capacitor unit before repair.

In contrast, when the capacitor element 33B malfunctions due to short circuit in the fabrication method for the drive circuit layer 11A, the connection between the second capacitor electrode 33B2 and the line 112L is blocked, and the first backup electrode 33P1 and the line 112L are electrically connected by irradiating the disconnect-able portion and the connectable portion in the region $D_B$ (Y in FIG. 10B). With this, the capacitor element 33A is disconnected, and the backup capacitor element 33P is connected. Thus, the capacitance of the capacitor unit as the capacitor unit 33 before repair is maintained.

Here, a comparison with a conventional layout in which the backup capacitor element 33P is not provided, and the region in the capacitor element 33A includes a region in the backup capacitor element 33P, and the capacitor elements 33A and 33B are arranged in the same area shall be described. In this case, when the capacitor element 33A or 33B is short-circuited, one of the capacitor elements is disconnected, making the capacitance after repair to half.

In contrast, using the layout according to the embodiment 4 secures the capacitance two-thirds or higher of the capacitance before repair in the same area as the area for the conventional light-emitting pixel with one laser irradiation.

With this, the light-emitting pixel 31 after repair allows suppressing the reduction in the capacitance after repair without increasing the pixel area.

Although only some exemplary embodiments of the display device and the fabrication method for the display device according to the present invention have been described in detail above, those skilled in the art will readily appreciate that many modifications are possible in the exemplary embodiments without materially departing from the novel teachings and advantages of the present invention. Accordingly, another embodiment implemented by any combination of components in the embodiments 1 to 4, a variation that the skilled person would come up with in the scope of the present invention according to the embodiments 1 to 4, devices in which the display device according to the present invention is incorporated are intended to be included within the scope of the present invention.

In the embodiments 1 to 4, the configuration of the capacitor unit which includes a bottom-gate transistor as a component of the pixel circuit is described. However, the present invention is applicable to a case in which a top-gate transistor is used as a component of the pixel circuit.

In addition, the laser irradiation direction may not be from above the display panel 10 but from below through the lower substrate. The laser irradiation method from below is advantageous compared to the laser irradiation method from above for repairing the capacitor unit after the display element layer 11B is formed on the drive circuit layer 11A. This is because; the laser irradiation method from below can eliminate the possibility of damaging the display element layer 11B by the passing laser, since the laser does not pass through the display element layer 11B.

In addition, in the embodiments 1 and 4, an example in which only two capacitor elements composes the capacitor unit is described. However, the number of the capacitor elements may be three or more, depending on the malfunction rate of the light-emitting pixel 11, required pixel area, and capacitance.

In the embodiments 1 to 4, short-circuit between electrodes due to particles eccentrically located between electrodes is described as a cause of malfunction of the capacitor unit. However, the short circuit in the embodiments is not limited to dead short. For example, the short-circuit includes micro resistance value and capacitance value, such as point contact of particles.

Figure 11:
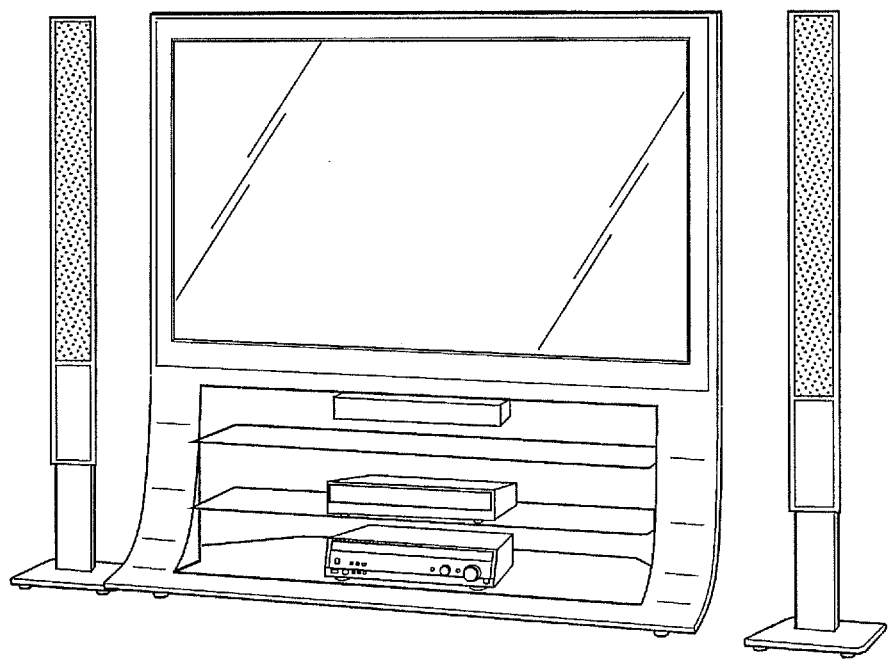
FIG. 11 is an external view of a thin flat TV in which the image display device according to the present invention is incorporated.
Figure 12:
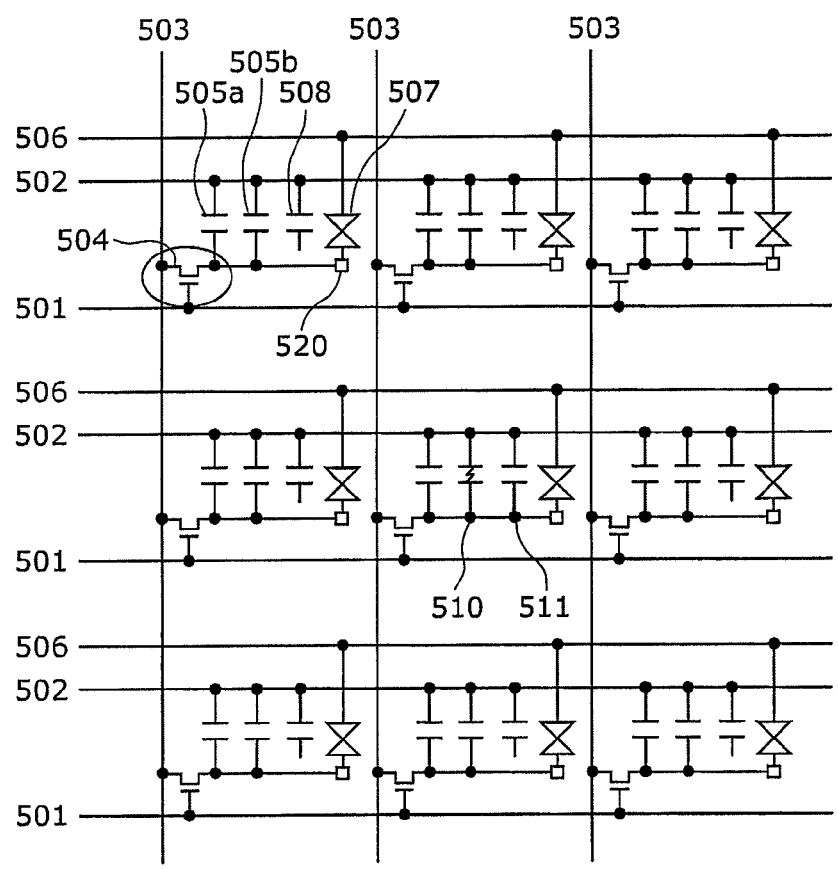
FIG. 12 is a circuit diagram illustrating a part of the screen of the liquid crystal device disclosed in Patent Literature 1.

For example, the display device according to the present invention is incorporated in a thin flat TV illustrated in FIG. 11, for example. With this, the light-emitting pixel that does not emit light with normal timing for light emission is repaired, implementing high-definition thin flat TV with a display panel of improved quality.

INDUSTRIAL APPLICABILITY

The display device and the fabrication method for the display device are useful for the technical field which requires large screen and high definition, such as thin televisions and personal computer displays.

What is claimed is:

1. A display device comprising
a two-dimensional array of a plurality of display pixels each having a display element layer and a drive circuit layer stacked, the drive circuit layer being for driving the display element layer,
wherein the drive circuit layer includes
a parallel-plate capacitor unit having a first electrode layer, a second electrode layer, and an insulating layer, the first electrode layer and the second electrode layer being arranged opposite to each other in a stacking direction, and the insulating layer being provided between the first electrode layer and the second electrode layer,
the parallel-plate capacitor unit includes:
a capacitor element having a first capacitor electrode and a second capacitor electrode, the first capacitor electrode being electrically connected to a first line and provided in the first electrode layer, the second capacitor electrode being electrically connected to a second line and provided in the second electrode layer opposite to the first capacitor electrode in the stacking direction;
a backup capacitor element having a first backup capacitor electrode provided in the first electrode layer and a second backup capacitor electrode electrically connected to the first line and provided in the second electrode layer opposite to the first backup capacitor electrode in the stacking direction;
a disconnect-able portion at which an electric connection between the second capacitor electrode and the second line can be disconnected; and
a connectable portion at which the first backup capacitor electrode and the second line can be electrically connected, and
the disconnect-able portion and the connectable portion are arranged at a position in which the disconnect-able portion and the connectable portion overlap in the stacking direction.

2. The display device according to claim 1,
wherein the disconnect-able portion is provided on a line connecting the second capacitor electrode and the second line, and has a shape that allows fusion-cutting of the connection between the second capacitor electrode and the second line by laser irradiation, and
the connectable portion includes a line for connection extended from the first backup capacitor electrode to a position overlapping with the disconnect-able portion, and has a shape that allows welding, by laser irradiation, of the line for connection and the second line disconnected from the second capacitor electrode.

3. The display device according to claim 2,
wherein the line for connection has an end surface in parallel with the stacking direction above the disconnect-able portion.

4. The display device according to claim 1,
wherein the parallel-plate capacitor unit includes two of the capacitor elements and one of the backup capacitor element.

5. The display device according to claim 1,
wherein the second backup capacitor electrode is electrically connected to the first line via a contact hole provided in the insulating layer.

6. The display device according to claim 1,
wherein the capacitor element is a holding capacitor element which holds, as a hold voltage, a voltage according to a signal voltage applied to each of the display pixels,
the drive circuit layer includes a drive transistor having a gate electrode connected to one of the terminals of the capacitor element, and converts the hold voltage to a signal current which is a current between a source electrode and a drain electrode through an application of the hold voltage to the gate electrode, and
the display element layer includes a light-emitting element which emits light when the signal current flows.

7. The display device according to claim 6,
wherein one of the first electrode layer and the second electrode layer is provided in one of a source-drain electrode layer and a gate electrode layer of the drive transistor, and
the other of the first electrode layer and the second electrode layer is provided in the other of the source-drain electrode layer and the gate electrode layer of the drive transistor.

8. A fabrication method for a display device which includes a two-dimensional array of a plurality of display pixels each having a display element layer and a drive circuit layer stacked, the drive circuit layer being for driving the display element layer, said fabrication method comprising:
forming the drive circuit layer including
a parallel-plate capacitor unit having a first electrode layer, a second electrode layer, and an insulating layer, the first electrode layer and the second electrode layer being arranged opposite to each other in a stacking direction, and the insulating layer being provided between the first electrode layer and the second electrode layer,
the parallel-plate capacitor unit including:
a capacitor element having a first capacitor electrode and a second capacitor electrode, the first capacitor electrode electrically connected to a first line and provided in the first electrode layer, the second capacitor electrode electrically connected to a second line and provided in the second electrode layer opposite to the first capacitor electrode in the stacking direction;
a backup capacitor element having a first backup capacitor electrode provided in the first electrode layer and a second backup capacitor electrode electrically connected to the first line and provided in the second electrode layer opposite to the first backup capacitor electrode in the stacking direction;
a disconnect-able portion at which an electric connection between the second capacitor electrode and the second line can be disconnected; and
a connectable portion at which the first backup capacitor electrode and the second line can be electrically connected, and
the disconnect-able portion and the connectable portion arranged at a position in which the disconnect-able portion and the connectable portion overlap in the stacking direction,
forming the display element layer;
testing the capacitor element formed in the drive circuit layer forming; and
repairing the capacitor unit having a capacitor element determined to be malfunctioning in the testing, by disconnecting the electric connection between the second capacitor electrode and the second line at the disconnect-able portion and connecting the first backup capacitor electrode and the second line at the connectable portion.

9. The fabrication method for the display device according to claim 8,
wherein the disconnect-able portion and the connectable portion are irradiated with laser at the same time in the repairing.

10. The fabrication method for the display device according to claim 9, further comprising reinforcing connection with the connectable portion by attaching low-resistance metal material on the connectable portion after the repairing.

\* \* \* \* \*